United States Patent [19]

Moon

[11] Patent Number: 4,942,368

[45] Date of Patent: Jul. 17, 1990

[54] SIGNAL FEEDBACK AMPLIFIER FOR A CABLE-TV CONVERTER

[75] Inventor: Frederick H. Moon, Seoul, Rep. of Korea

[73] Assignee: Samsung Electro-Mechanics Co., Ltd., Suwon-City, Rep. of Korea

[21] Appl. No.: 343,154

[22] Filed: Apr. 25, 1989

[30] Foreign Application Priority Data

Apr. 27, 1988 [KR] Rep. of Korea .................... 88-5993

[51] Int. Cl.⁵ ............................................. H03G 3/12
[52] U.S. Cl. .................................... 330/282; 330/284; 358/184
[58] Field of Search ............... 330/110, 144, 145, 282, 330/284, 86; 358/184

[56] References Cited

U.S. PATENT DOCUMENTS 3,613,011 10/1971 Wood ............................... 330/110 X

FOREIGN PATENT DOCUMENTS 2012412 10/1970 Fed. Rep. of Germany ...... 330/282

Primary Examiner—James B. Mullins
Attorney, Agent, or Firm—Ladas & Parry

[57] ABSTRACT

In an amplifier system for a cable-TV converter, the amplifier system having an amplifier having a transistor with a base connected to an input port of the amplifier system that provides a video IF signal and a collector for connection to an output port of the amplifier system, a variable gain device is connected between the collector of the transistor and the output port for varying the gain therebetween. A variable negative feedback device forms a closed loop between the collector and the base of the transistor for varying negative feedback of the variable negative feedback device inversely with the gain of the variable gain device. An impedance matching device is connected between the variable gain device and the output port for maintaining a substantially constant output impedance at the output port.

10 Claims, 2 Drawing Sheets

SIGNAL FEEDBACK AMPLIFIER FOR A CABLE-TV CONVERTER

BACKGROUND OF THE INVENTION

This invention relates to an amplifier having a stable gain for use at the tuner of a cable-connected TV and, more particularly, to a feedback amplifier for a cable-to-TV (hereafter, cable-TV) converter which can adjust easily and at the same time the amplifier gain, the distortion reduction, and the output impedance.

A cable TV system that receives broadcast television signals with an antenna having a high sensitivity and distributes the signals to homes using a wideband transmission line such as a coaxial cable has become popular. The cable TV system can not only retransmit the broadcast television signal, but also provide other information. In the latter case, at least, each receiving TV in the system requires a tuner for a cable-TV converter that can provide a stable gain.

Generally, the final stage of a cable-TV tuner, which sends an amplified video IF signal to the TV, has an amplifier stage, but no automatic gain control (AGC), and gain deviations from one converter in the system to another cannot be controlled. Thus, if the gain of one converter is larger, its distortion increases, too, due to the increment of gain. In such case, stable gain cannot be obtained by controlling the gain of only the final stage. Therefore, the tuner gain must be controlled additionally for distortion reduction, while maintaining the proper output impedance and keeping down the size and weight of the cable-TV converter.

As shown FIG. 1, which shows the final amplifier stage of the tuner of a conventional cable-TV converter, the final-stage IF amplifier 1 is connected between an input port 3, which receives the video IF signal, and a variable pad 2. The variable pad 2 controls the gain of the tuner and provides the amplified video IF signal to an output port 4. In such a final amplifier stage, the IF amplifier must have a gain large enough to avoid gain deviation, while the desired gain range is satisfied using the variable pad 2. For this, a cascaded bipolar transistor is used for the amplifier 1 to provide a large signal gain and the variable pad 2 is connected for reducing the distortion to the output port 4.

In this previous technology, the variable pad 2 consists of an independently variable resistor. Another variable pad (not shown) can be used at the input to the amplifier, too, to reduce the distortion when the amplifier has the large gain desired as explained above. As a result, too many circuit components are needed, at least for a cable-TV converter, which requires small size and weight. Further, the design of the converter becomes too complex and its fabrication cost too high on the account of the many circuit components that are used. Furthermore, the output impedance of the converter is not well maintained while controlling the gain of an amplifier.

SUMMARY OF THE INVENTION

The present invention has been made in consideration of the above and has for its object providing a feedback amplifier for a cable-TV converter in which stable gain can be obtained.

It is another object to provide a feedback amplifier for a cable-TV converter in which the gain, distortion, and output impedance can be adjusted at the same time.

It is still another object to provide a feedback amplifier for a cable-TV converter of lower fabrication cost, size, and weight by using the minimum number of components.

Such objects are achieved in a feedback amplifier for a cable-TV converter by adjusting the gain of the amplifier with negative feedback controlled by a variable resistor, which also maintains the proper output impedance. In an embodiment of the present invention, therefore, a single bipolar-transistor signal feedback amplifier has a variable gain device connected between the collector of the bipolar transistor and the output port of the amplifier, a variable negative feedback device forming a closed loop between the base and the collector of the transistor and being connected to the variable gain device for varying the negative feedback thereof inversely with the gain device, and an impedance matching device connected between the variable gain device and the output port.

DETAILED DESCRIPTION

An embodiment of the present invention will now be described in more detail with reference to FIGS. 2 to 5d.

Figure 1:
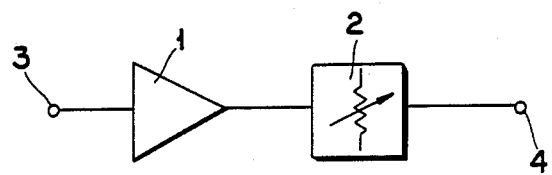
FIG. 1 is a circuit diagram of a conventional amplifier for a cable-TV converter.
Figure 2:
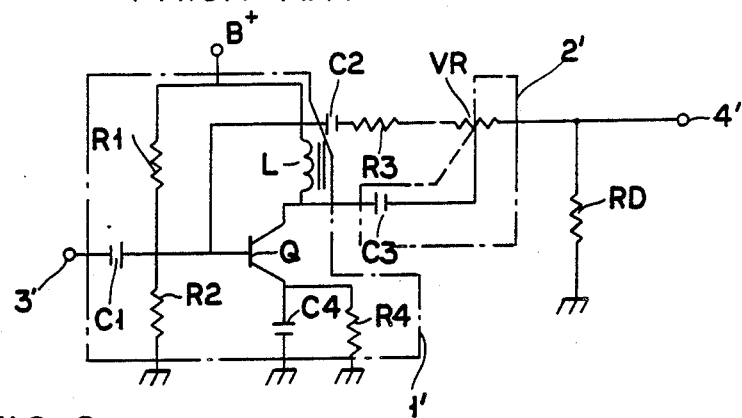
FIG. 2 is a circuit diagram of an embodiment of the present invention.
Figure 3:
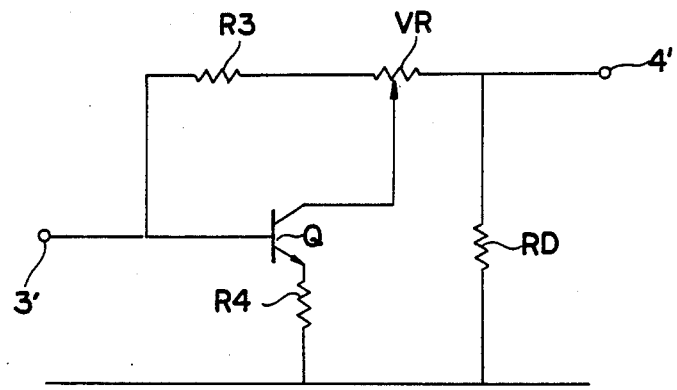
FIG. 3 is a diagram of a simplified circuit substantially equivalent to that of FIG. 2 and, thus, still representing the major parts of the present invention.

FIG. 2 shows a conventional amplifier 1' to have a condensor, i.e. capacitor C1 connected between the input port 3 and the base of the single bipolar transistor Q of the amplifier. It serves as a dc-blocking capacitor that passes the ac video IF signal from the input port 3, to the transistor base.

Bias resistors R1 and R2 are also connected to the base of the transistor. A choke coil L is connected between the collector of the transistor and the resistor R1 for providing a supply voltage. A bias voltage source B+ is also connected to the resistor R1. A capacitor C4 and a resistor R4 are connected in parallel to the emitter of the transistor Q to stabilize the collector current due to the resulting stabilization of the emitter current. The capacitor C4 is small, however, for use only if the ac video IF signal frequency bandwidth should increase; the capacitor C4 is not used in general.

The collector of the transistor Q is connected to a movable center tap of a thus-variable resistor VR through a dc-blocking capacitor C3. One end of the variable resistor VR is connected to an output port 4' of the amplifier with a load resistor RD in parallel therebetween and the opposite end of the variable resistor is connected to one end of a negative feedback resistor R3. The opposite end of the negative feedback resistor R3 is connected to the base of the transistor through a dc-blocking capacitor C2. As a result, the negative feedback from the collector to the base of the transistor Q adjusts the gain by controlling the feedback-quantity and variable-output impedances inversely.

Figure 4A:
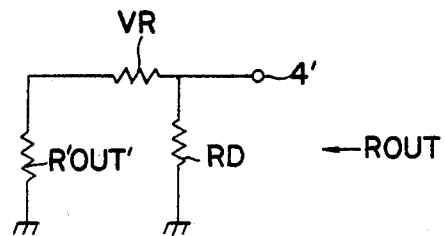
FIGS. 4a and 4b are equivalent circuit diagrams showing output impedance according to gain variation in the embodiment of the present invention of FIG. 2.
Figure 4B:
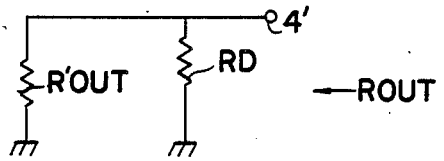

Impedance matching of the variable gain path to the output port is achieved in this way, too, as shown in FIGS. 4a and 4b. That is, the high impedance R'OUT of the collector of the transistor Q to the output port 4' is effectively in parallel with load resistor RD when the negative feedback quantity is small, i.e. the center tap (shown in FIGS. 2 and 3) of the variable resistor VR is at the one, output-port end of the variable resistor VR, as shown in FIG. 4b, but the low impedance R'OUT' of the collector of the transistor Q to the output port 4' is effectively in series with the variable resistor VR (and parallel with the load resistor RD) when the negative feedback quantity is large, i.e. the center tap (shown in FIGS. 2 and 3) of the variable resistor VR is at the opposite end of the variable resistor VR, away from the output port 4' and at resistor R3 in FIGS. 2 and 3, as shown in FIG. 4a.

To explain the operation of the amplifier 1' of the present invention, the bias and supply voltages are divided by bias resistors R1 and R2 and provided to the base of the transistor Q along with the video input IF signal, which is applied to the base of the transistor through the dc-blocking capacitor C1, so that an amplified video IF signal appears at the collector of the transistor Q. Although the bipolar amplifying transistor Q shown could be replaced by a field effect transistor (FET) (not shown), the bipolar transistor can provide such good gain and large output power that it is used in general.

The amplified video IF signal from the collector of the transistor is applied to the variable resistor VR through its center tap and the dc-blocking capacitor C3 to vary the gain and feedback by adjusting the variable resistor VR. Generally, the gain is reduced as the negative feedback quantity increases, but the distortion that might result is reduced by the stabilization. That is, if the negative feedback resistance decreases, the negative feedback quantity increases, so that the desired amplifier gain and the distortion reduction can be selected by adjusting the variable resistor for the variable gain feedback. If the negative feedback is large, the impedance at the output port 4' from the transistor would be small, but the variable resistor VR is then effectively in series with the output port 4', so that the output impedance can remain large, as shown in FIG. 4a. Conversely, if the negative feedback is small, the impedance at the output port 4' from the transistor would be large, but effectively only the load resistor RD is then in parallel with the output port 4', so that the high output impedance is only reduced relatively little, as shown in FIG. 4b. By these means, a fairly constant output impedance is maintained with respect to gain variation.

Figure 5A:
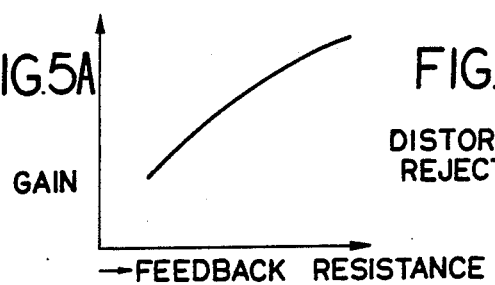
FIGS. 5a, 5b, 5c and 5d represent characteristic function curves of the embodiment the present invention of FIG. 2.
Figure 5C:
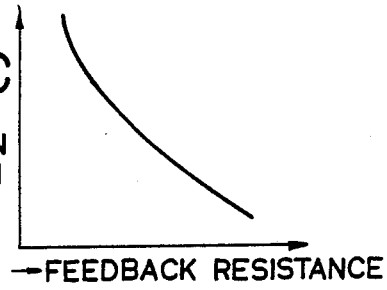
Figure 5B:
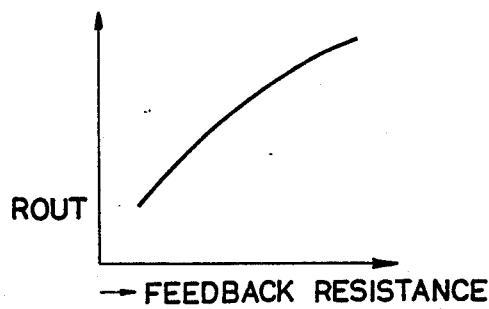
Figure 5D:
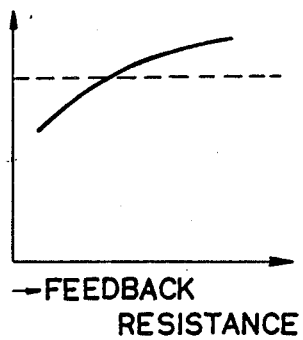

This is, if the negative feedback resistance decreases, the gain decreases, as shown FIG. 5a and the output impedance and distortion also decrease as shown in FIGS. 5b and 5c. Thus, the present invention can simply adjust the gain, while minimizing distortion reduction, and maintaining proper output impedance by controlling the variable resistor VR for the variable gain of the feedback amplifier.

Also, the signal feedback amplifier can be composed of only a few components, so that fabrication cost, size and weight can be reduced.

The invention is in no way limited to the embodiment described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. In an amplifier system for a cable-TV converter, the amplifier system having an amplifier having a transistor with a base connected to an input port of the amplifier system that provides a video IF signal and a collector for connection to an output port of the amplifier system, the improvement comprising:

variable gain means connected between the collector of the transistor and the output port for varying the gain therebetween;

variable negative feedback means forming a closed loop between the collector and the base of the transistor for varying negative feedback of the variable negative feedback means inversely with the gain of the variable gain means; and impedance matching means connected between the variable gain means and the output port for maintaining a substantially constant output impedance at the output port.

2. The amplifier system of claim 1, wherein the variable gain means comprises a DC-blocking capacitor and at least a portion of a variable resistor.

3. The amplifier system of claim 2, wherein the variable negative feedback means comprises, in a series, a fixed resistor, at least a portion of a variable resistor, and a DC-blocking capacitor.

4. The amplifier system of claim 3, wherein the impedance matching means comprises a load resistor connected in parallel between the variable gain means and the output port.

5. The amplifier system of claim 4, wherein the variable gain means comprises the portion of the variable resistor from one end of the variable resistor that is connected to the output port to a center tap of the variable resistor that is connected to the DC-blocking capacitor of the variable gain means, the DC-blocking capacitor of the variable gain means being connected to the collector of the transistor, and the variable negative feedback means comprises another portion of the variable resistor of the variable gain means from the center tap thereof to an opposite end thereof that is connected to one of the DC-blocking capacitor and fixed resistor of the variable negative feedback means.

6. The amplifier system of claim 3, wherein the variable gain means comprises the portion of the variable resistor from one end of the variable resistor that is connected to the output port to a center tap of the variable resistor that is connected to the DC-blocking capacitor of the variable gain means, the DC-blocking capacitor of the variable gain means being connected to the collector of the transistor, and the variable negative feedback means comprises another portion of the variable resistor of the variable gain means from the center tap thereof to an opposite end thereof that is connected to one of the DC-blocking capacitor and fixed resistor of the variable negative feedback means.

7. The amplifier system of claim 2, wherein the impedance matching means comprises a load resistor connected in parallel between the variable gain means and the output port.

8. The amplifier system of claim 1, wherein the variable negative feedback means comprises, in a series, a fixed resistor, at least a portion of a variable resistor, and a DC-blocking capacitor.

9. The amplifier system of claim 8, wherein the impedance matching means comprises a load resistor connected in parallel between the variable gain means and the output port.

10. The amplifier system of claim 1, wherein the impedance matching means comprises a load resistor connected in parallel between the variable gain means and the output port.

* * * * *